United States Patent [19]
Gemma et al.

[11] Patent Number: 5,294,820
[45] Date of Patent: Mar. 15, 1994

[54] FIELD-EFFECT TRANSISTOR

[75] Inventors: Nobuhiro Gemma, Yokohama; Koichi Mizushima, Kamakura; Akira Miura, Toride; Makoto Azuma, Yokohama; Toshio Nakayama, Fujisawa, all of Japan

[73] Assignee: Kabushiki Kaisha Toshiba, Kawasaki, Japan

[21] Appl. No.: 832,371

[22] Filed: Feb. 7, 1992

Related U.S. Application Data

[63] Continuation of Ser. No. 518,236, May 7, 1990, abandoned, which is a continuation of Ser. No. 318,485, Mar. 3, 1989, abandoned, which is a continuation of Ser. No. 29,968, Mar. 25, 1987, abandoned.

[30] Foreign Application Priority Data

Mar. 25, 1986 [JP] Japan .................... 61-66278

[51] Int. Cl.[5] ............................ H01L 29/78
[52] U.S. Cl. .................... 257/324; 257/15; 257/16; 257/40; 257/325; 257/405; 257/406
[58] Field of Search .............. 257/15, 16, 40, 295, 257/314, 324, 325, 402, 405, 406, 629

[56] References Cited

U.S. PATENT DOCUMENTS 4,688,078 12/1985 Hseih ................... 357/23.5

FOREIGN PATENT DOCUMENTS 0165111 12/1985 European Pat. Off. .
0185941 7/1986 European Pat. Off. .
2637206 3/1977 Fed. Rep. of Germany .
61-37862 2/1986 Japan .

OTHER PUBLICATIONS

Kuhn, M., "A Quasi-Static Technique For MOS C-V and Surface State Measurements," Solid-State Electronics, vol. 13, No. 6, 1970, pp. 873-885.
Thin Solid Films, vol. 132, No. 1/4, Oct. 1985, pp. 33-39, C. D. Fung et al., "Planar silicon field-effect transistors with Langmuir-Blodgett gate insulators".
Applied Physics Letters, vol. 49, No. 18, Nov. 3, 1986, pp. 1210-1212, A. Tsumura et al. "Macromolecular electronic device: Field-effect transistor with a polythiophene thin film".
Thin Solid Films vol. 134 pp. 195-199; A. Barraud et al; Dec. 1985.

*Primary Examiner*—Sara W. Crane
*Attorney, Agent, or Firm*—Oblon, Spivak, McClelland, Maier & Neustadt

[57] ABSTRACT

A field-effect transistor comprising a semiconductor substrate having source and drain regions and a gate electrode, wherein a thin organic film including donor and acceptor molecules is provided between the semiconductor substrate and the gate electrode. When a predetermined voltage is applied to the gate electrode, charge transfer occurs between the donor and acceptor molecules included in the thin organic film, thereby controlling the surface potential of the semiconductor substrate.

13 Claims, 10 Drawing Sheets

FIELD-EFFECT TRANSISTOR

This is a continuation of application Ser. No. 07/518,236, filed on May 7, 1990, now abandoned which is a continuation of application Ser. No. 07/318,485 filed on Mar. 3, 1989, now abandoned, which is a continuation of application Ser. No. 07/029,968, filed Mar. 25, 1987, now abandoned.

BACKGROUND OF THE INVENTION

I. Field of the Invention

The present invention relates to a field-effect transistor using a thin organic film for a gate portion.

II. Description of the Prior Art

Recent progress in a technique represented by the Langmuir-Blodgett process (to be referred to as the LB process hereinafter) for forming a super thin film of organic molecules resulted in active development in techniques for applying a thin organic film to various elements. Research in the development of such techniques is being done by many organizations, such as research by G. G. Roberts at Durham University of an MIS element using a thin organic film. However, an element having a novel function effectively utilizing the characteristics of a thin organic film has not yet been realized.

In terms of applications to an electronic element, the most significant characteristic of the organic material is a charge transfer phenomenon between molecules. Organic molecules include donor molecules which have a low ionization potential and supply electrons to other molecules to take on a positive ionic state, and acceptor molecules which have a high electronic affinity and receive electrons from other molecules to take on a negative ionic state. It is known that a compound called a charge transfer complex is formed between these two types of molecules. For example, a compound of perylene and tetracyanoquinodimethane (TCNQ) consists of neutral molecules in which no charge is transferred, but tetramethylphenylenediamine (TMPD) and TCNQ form a compound in which respective molecules are in positive or negative states. In addition, a compound of TCNQ with tetrathiofluvalene (TTF) is known to change from a neutral to an ionic state due to a change in temperature or pressure.

When such a charge transfer phenomenon of the organic material is applied as an operational principle of an electronic element, the charge transfer characteristics such as efficiency, response time, and controlability must be excellent, and a material and an electronic element causing charge transfer must be easy to prepare. In this case, as for a charge transfer complex, preparation of crystals is very difficult, and external control of charge transfer is also difficult. It has been proposed to control charge transfer between a metal film and an organic molecule film by light or an electric field for application to a switching or memory element. However, a big problem lies in the efficiency, response time, and lifetime of a charge transfer. Thus, although charge transfer may be applied to various elements, it has not yet been practically used.

On the other hand, development of a novel functional element which cannot be realized by a conventional MOSFET LSI using silicon is expected. For example, a research is being done on an electronic element using a super lattice structure consisting of a GaAs film and an AlGaAs film as a compound semiconductor. However, since lattice constants or lattice structures of two kinds of compounds must be matched to obtain a super lattice structure of a compound semiconductor, selection range of compounds is limited and fabrication of the super lattice is costly and time-consuming.

Furthermore, an FET using a compound semiconductor has various problems that a MOSFET using silicon never has. For example, because of a high interface state density, a surface potential of a semiconductor does not change substantially even when a gate voltage is applied. This is a so-called pinning phenomenon of the Fermi level. In addition, since mobility of carriers of GaAs or InP is higher than that of Si, a high speed operation can be expected. However, an oxide film with less defects, such as an $SiO_2$ film in the case of silicon, cannot be obtained by such compound semiconductors. More specifically, an oxide film obtained by performing thermal oxidation or anodic oxidation of such a compound semiconductor has a very high interface state density. For this reason, when a MIS type FET is formed using as a gate insulating film an oxide film obtained by thermal oxidation or anodic oxidation or another inorganic oxide such as $SiO_2$ or $Al_2O_3$ obtained by, e.g., the CVD method, no FET operation occurs because the surface of the semiconductor is not inverted, due to a high interface state density.

As described above, although an electronic element having a novel function which cannot be obtained by a conventional MOSFET using silicon is expected, it has not yet been realized. In addition, because a good gate insulating film cannot be obtained and an interface state density is high in an FET using a compound semiconductor which is expected to have a higher performance than that of a MOSFET using silicon, an MIS type FET has not yet been realized.

SUMMARY OF THE INVENTION

It is an object of the present invention to provide a high performance FET which eliminates the above problems and has a novel function.

An FET according to the present invention is characterized by comprising a thin organic film including donor molecules and acceptor molecules between a gate electrode and the surface of a semiconductor. By utilizing a charge transfer phenomenon between donor and acceptor molecules, a surface level of the semiconductor is controlled.

In the FET according to the present invention, the thin organic film may have a stacking structure of a first thin film including donor molecules and a second thin film including acceptor molecules, or may be a single thin film including both the donor and acceptor molecules. In addition, the thin organic film may have a super lattice structure obtained by alternately stacking a plurality of first and second thin films including donor and acceptor molecules, respectively. Furthermore, in these thin organic films, a number of types of donor and acceptor molecules may be combined as needed.

At least one of the surfaces of the thin organic films preferably comprises a third thin film including insulating organic molecules.

In the FET according to the present invention, it is important to control the thickness of the thin organic film to obtain good element characteristics. Therefore, a monomolecular film formed by the LB process or a super lattice structure obtained by stacking a plurality of monomolecular films is preferably used as a thin film.

In the FET according to the present invention, by applying a predetermined voltage to a gate electrode, charge transfer occurs between the donor and acceptor molecules included in the thin organic film, thereby controlling a surface potential of the semiconductor. The change of surface potential of the semiconductor is discontinuous, and hence a current flowing between the drain and source of the FET changes discontinuously. Therefore, by controlling the magnitude of the drain-source current before and after charge transfer to correspond to an ON-OFF operation of the FET, switching control of the FET can be realized.

In addition, by selecting the type and structure of the thin organic film, a threshold voltage or a difference in drain-source current during the ON and OFF operations can be set arbitrarily. Moreover, since the magnitude of changes in surface potential of the semiconductor along with charge transfer is determined by the concentrations of the donor and acceptor molecules included in the thin organic film, a structure can be obtained wherein the surface potential of the semiconductor can be controlled without being adversely affected even when an interface state of the semiconductor has a high density. Thus, an MIS type FET which is conventionally difficult to obtain can be realized.

Note that when the thin organic film between the gate electrode and the semiconductor surface is of a stacking structure of a first thin organic film including donor molecules and a second thin organic film including acceptor molecules, charge transfer occurs between the first and second thin organic films. On the other hand, when the thin organic film includes both the donor and acceptor molecules, charge transfer occurs within the film if the film is a single molecular film, and occurs between the films if the film has a stacking structure of single molecular films.

In addition, the thin organic film used in the present invention may include organic molecules having donor and acceptor radicals.

A description has been made with reference to the case wherein a thin organic film containing both donor and acceptor molecules is used. However, the present invention is not limited to the above case but includes the case wherein a thin organic film containing only donor molecules or a thin organic film containing only acceptor molecules is used. In these cases, charge transfer occurs between a metal electrode and donor or acceptor molecules, so that a surface potential of a semiconductor can be controlled, thereby realizing switching control of an FET.

Note that a thickness of the thin organic film is is preferably between 50 Å and 10,000 Å and, more preferably, between 50 Å and 1,000 Å.

The following donor molecules can be used as the donor molecules used in the present invention.

(1) Fulvalene type donors having the undermentioned structural formulas:

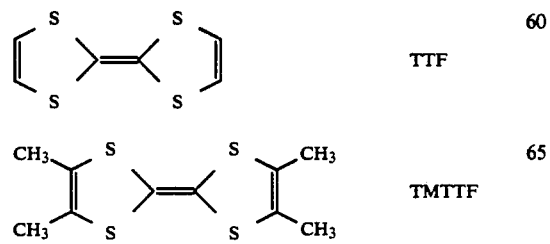

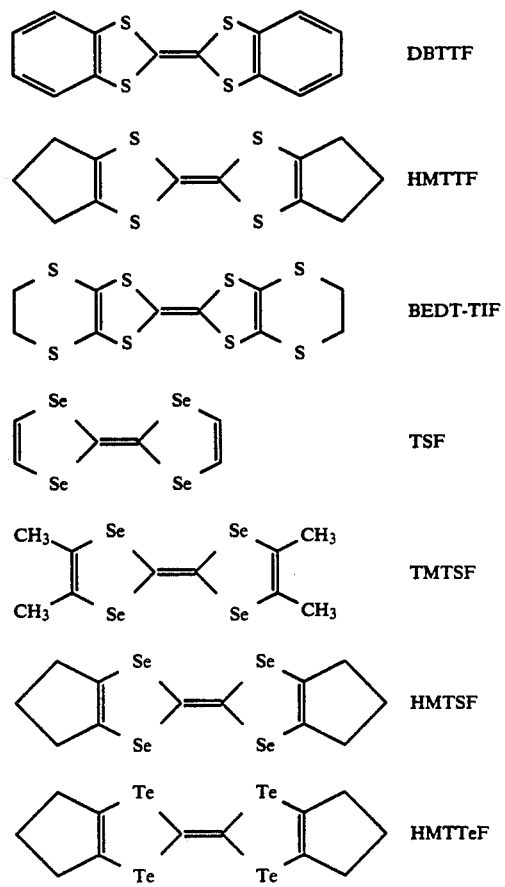

(2) S-containing heterocyclic donors having the undermentioned structural formulas:

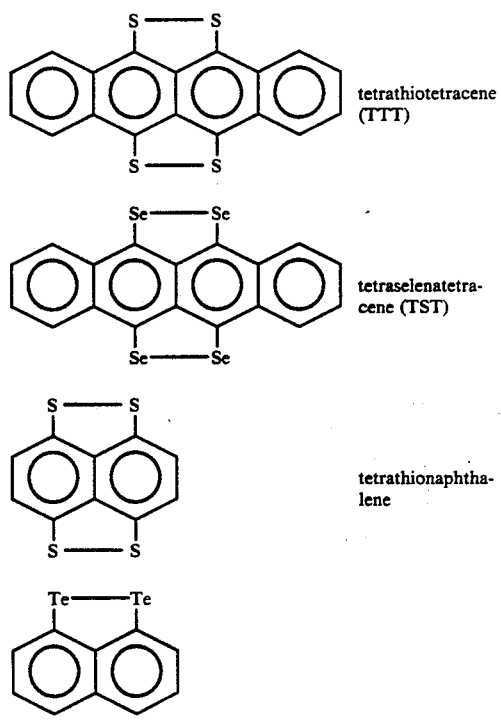

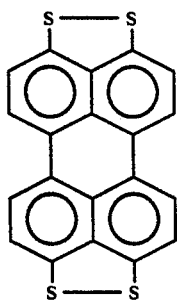 tetrathioperillene

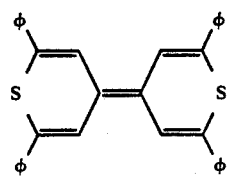 tetraphenyl-bithio pyralydene (BTP)

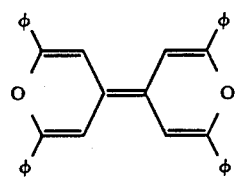

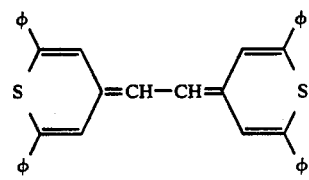

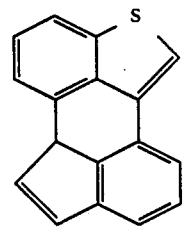 bizenzothiophene (BBT)

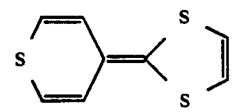

Note: φ given in the above formulas represents a phenyl moiety.

(3) Amine type donors having the undermentioned structural formulas:

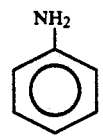 aniline

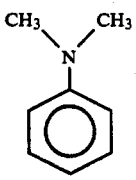 N-methyl aniline

 p-phenylene-diamine

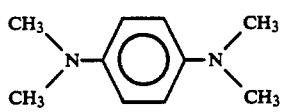 TMPD

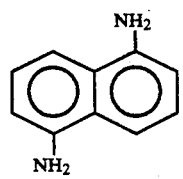 diaminonaphthalene

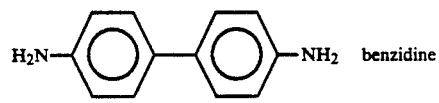 benzidine

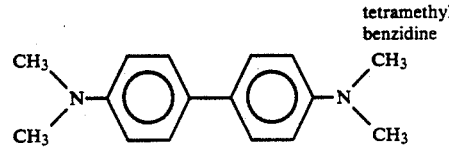 tetramethyl benzidine

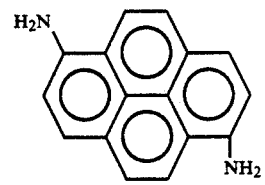 diaminopyrene

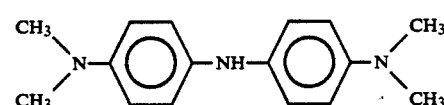

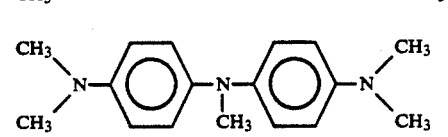

(4) Metal compound type donors having the undermentioned structural formulas:

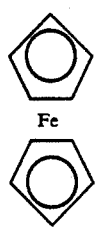 ferrocene

-continued
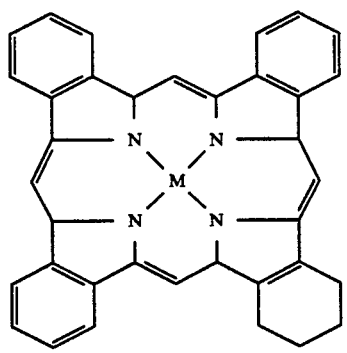 phthalocyanine M(Pc)
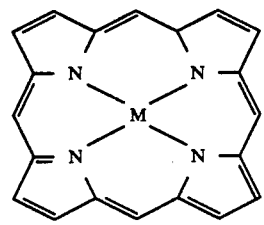 M(dbtaa)
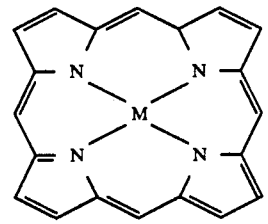 M(porphyrin)
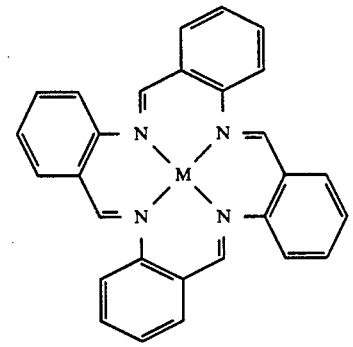 M(TAAB)
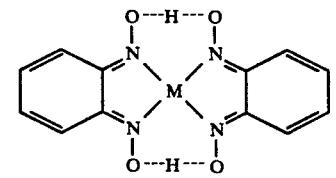 M(bqd)$_2$
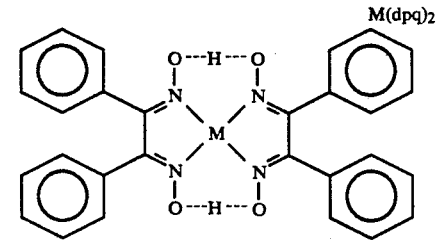 M(dpq)$_2$
-continued
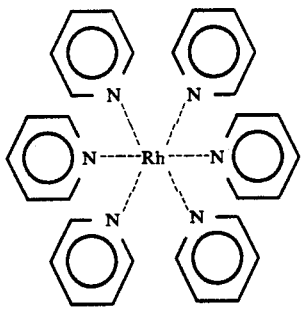 Rh(bpy)$_6^{2+}$
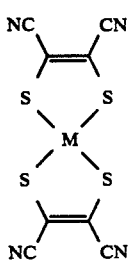 MNT
(5) Cyanine dye donors having the undermentioned structural formulas:
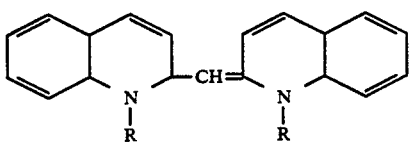
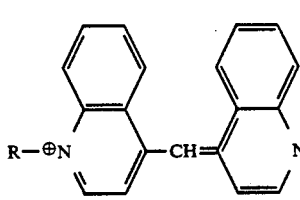
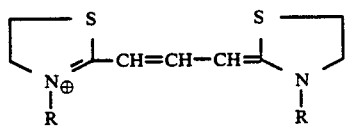
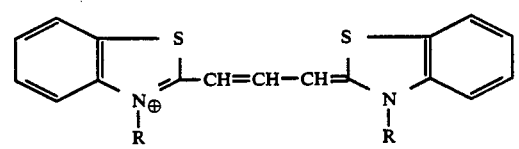
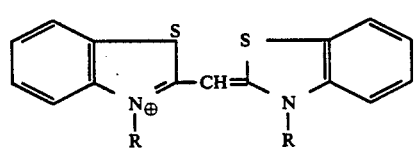
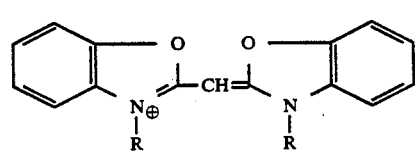

(6) N-containing heterocyclic donors having the undermentioned structural formulas:

phenothiazine phenazine quinoline acridine

DEPE²⁺

(7) Polymer type donors having the undermentioned structural formulas:

polyacetylene polypyrrole
X = O, N, S polypyridine poly-p-phenylene pol-p-phenylene-sulfide The present invention allows for the application of the derivatives of the donor type molecules indicated in items (1) to (7), which have a hydrophobic group with a structural formula $CH_3(CH_2)_n$, $CH_3(CH_2)_p(CH_2=CH_2)_q(CH_2)_l$ (where n and p+q+1 respectively represent larger numbers than 8), or a hydrophilic group with a structural formula of —COOH, —OH, $SO_3H$, —COOR', —$NH_2$, —$N^+(R')_3Y^-$ (Y denotes halogen ions), or have both said hydrophobic and hydrophilic groups.

Among the aforementioned donor molecules, amine type donors are preferred, but fulvalene type donors and S-containing heterocyclic compound are more preferred.

The above-mentioned acceptor molecules include the following:

(1) Cyano compound type acceptors having the undermentioned structural formulas:

TCNQ

Me₂TCNQ

TCNDQ

TNAP

TCNE

HCB

-continued
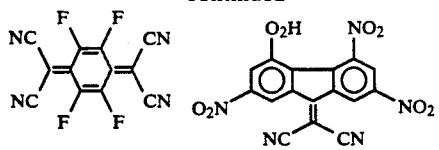
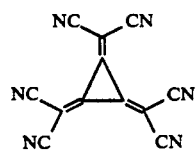
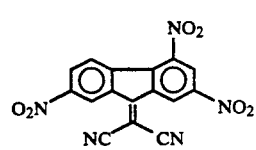   DTF
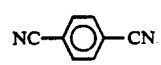 dicyanobenzene (DCNB)
(2) Quinoimine type acceptors having the undermentioned structural formulas:
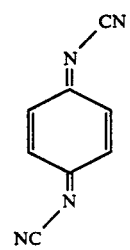   DCQI
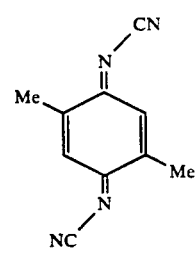   Me₂DCQI
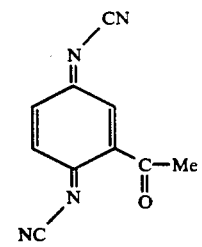   AcDCQI
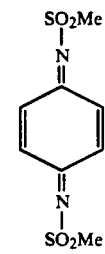
-continued
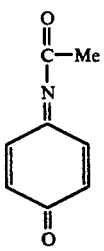
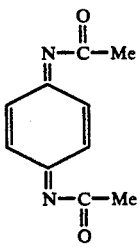
(3) Quinone type acceptors having the undermentioned structural formulas:
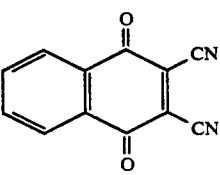   dicyanonaphthoquinone
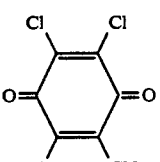   DDQ
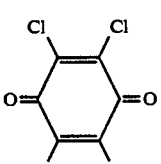   chloranil
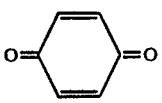   benzoquinone
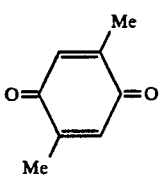   2,5-dimethylbenzoquinone
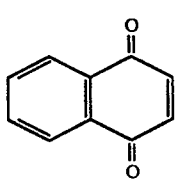   naphthoquinone -continued

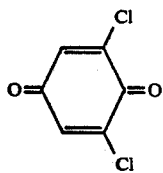 2,6-dichlorobenzoquinone

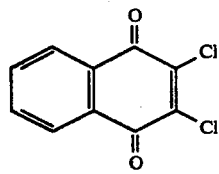 2,3-dichloronaphthoquinone (4) Nitro-compound type acceptors having the undermentioned formulas:

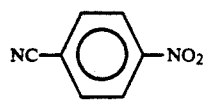 p-nitrocyanobenzene

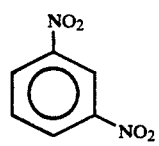 1,3-dinitrobenzene

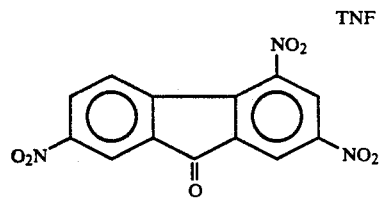 TNF

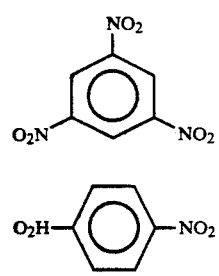 1,3,5-trinitrobenzene

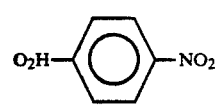 p-nitrobenzen

The present invention allows for the application of the derivatives of the acceptor type molecules having the essential structural formula indicated in items (1) to (4), which have hydrophobic substituents represented by $CH_3(CH_2)_n$, $CH_3(CH_2)_p(CH_2=CH_2)_q(CH_2)_l$ (where n and a total of p+q+l respectively denote a larger number than 8), or hydrophilic groups represented by —COOH, —OH, —SO$_3$H, —COOR', —NH$_2$, —N$^+$(R')$_3$Y$^-$ (Y denotes halogen ions), or have both such hydrophobic and hydrophilic radicals.

Among the above-listed acceptor molecules, quinone type acceptors are preferred, but cyano compound type and quinoimine type acceptors are more preferred.

The above-mentioned insulating or inactive organic molecules include the undermentioned types.

(1) Substitutable saturated or unsaturated hydrocarbon derivatives which are expressed by the following general structural formula:

R—X where R represents a hydrophobic groups formed of substitutable $CH_3(CH_2)_n$— or $CH_3(CH_2)_p(CH_2=CH_2)_q(CH_2)_l$ (where n and a total of p+q+l respectively represent a larger number than 8), and X represents hydrophilic groups, including, for example, —COOH, —OH, —SO$_3$H, —COOR', —NH$_2$, —N$^+$(R')$_3$Y$^-$ (Y represents halogen ions).

(2) Various polymerizable molecules

The subject polymerizable molecules may be represented, for example, by:

polymers of vinyl compound such as substitutable acrylate, methacrylate, vinyl ether, styrene, vinyl alcohol, acrylamide;

α-amino acids such as alanine, glutamate, aspartate;

amino acids, for example, ε-aminocaprolate other than α-amino acid; and polyamide polymers composed of a 1:1 mixture of diamines, such as hexamethylene diamine, and carbonic acid, such as hexamethylene diamine.

If possessed of a property of being fabricated into a film by themselves, the above-mentioned molecules (2) can be applied intact. The molecules which can not be fabricated into a film by themselves are applied when mixed with the insulating molecules (listed in item (1)) which can be independently formed into a film.

DETAILED DESCRIPTION OF THE PREFERRED EMBODIMENTS

A charge transfer phenomenon in a thin film hetero structure, i.e., a stacking structure of a thin organic film (donor molecule film) including donor molecules and a thin organic film (acceptor molecule film) including acceptor molecules in an FET of the present invention will now be described in detail below.

Figure 1:
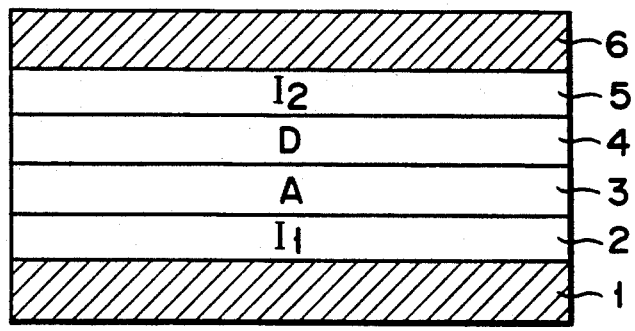
FIG. 1 is a sectional view of a thin organic film used in an FET of the present invention.

FIG. 1 shows a structure wherein a hetero structure of donor molecule film 4 and acceptor molecule film 3 is sandwiched between two electrodes 1 and 6. Organic thin films (insulating molecule films) 2 and 5 are interposed between electrodes 1 and 6 and the hetero structure. Films 2 and 5 are provided as barriers to prevent charge transfer between electrode 1 and film 3 and between electrode 6 and film 4.

In such a structure, voltage $V_1$ is applied between electrodes 1 and 6 so that electrode 1 is positive. When voltage $V_1$ becomes larger than voltage $V_{tr}$ given by equation (1) below, electrons transit from film 4 to film 3, and the donor molecules assume a positive ionic state (D+) and the acceptor molecules assume a negative ionic state (A−).

$$V_{tr} = (1/a)(l/e)\{(I_p - E_A) - e^2/a\} \quad (1)$$

where $I_p$ is an ionization potential of the donor molecule; $E_A$, an electronic affinity of the acceptor molecule; l, a distance between electrodes 1 and 6; a, a distance between a hole of the donor molecule and an electron of the acceptor molecule; and e, a charge elementary quantity.

When electrons pass from the donor molecules to the acceptor molecules, a potential distribution in the hetero structure shows discontinuous changes.

Figure 2:
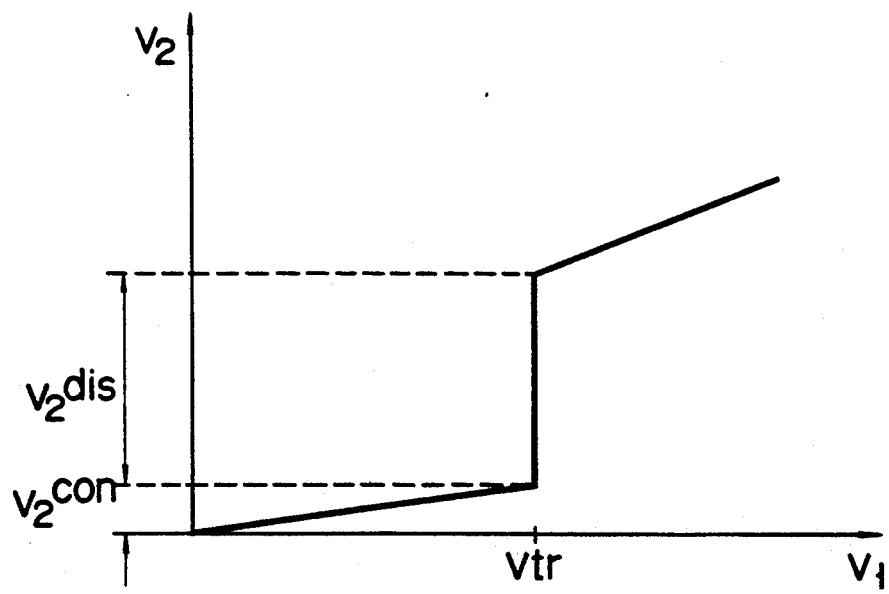
FIG. 2 is a graph for explaining a principle of charge transfer between organic molecules.

FIG. 2 shows a manner in which potential difference $V_2$ between a potential at an interface between films 3 and 2 and a potential of electrode 1 discontinuously changes due to voltage $V_1$ applied between the electrodes. The magnitude of shift $V_2^{dis}$ of a discontinuous voltage when $V_1 = V_{tr}$ is given by following equation (2).

$$V_2^{dis} = (b/l)(Q_{tr}/Q_M) \cdot V_2^{con} \quad (2)$$

where $Q_M$ is an amount of charge induced per unit area of an electrode surface; $Q_{tr}$, an amount of electrons transited from the donor to acceptor molecules per unit area; $V_2^{con}$, as shown in FIG. 2, an amount of continuous change in $V_2$ before electron transition occurs; and b, a distance between an interface between films 3 and 2 and a surface of electrode 1.

As described above, by utilizing a discontinuous change of the potential distribution along with electron transition between organic molecules, an FET having a novel function can be realized.

Examples of the present invention will now be described in detail below.

EXAMPLE 1

Figure 3:
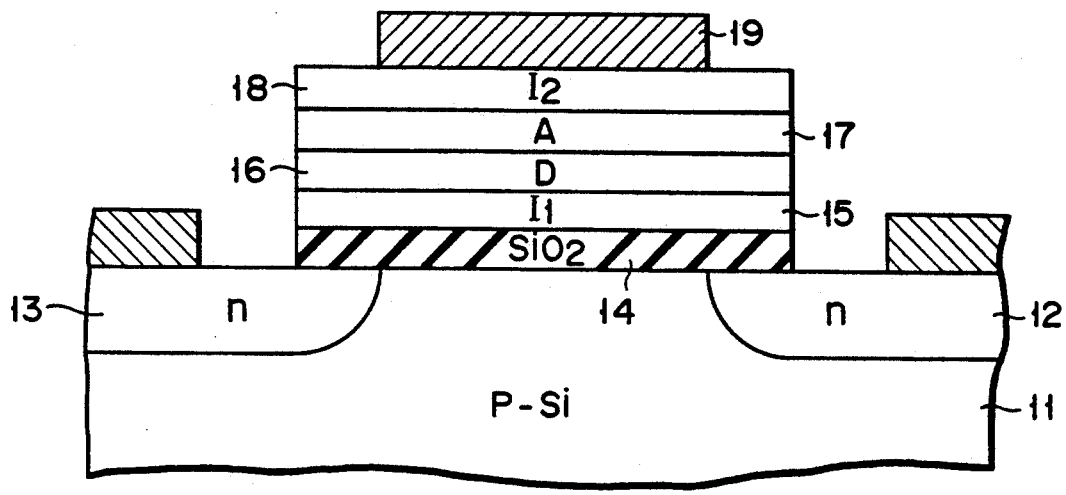
FIG. 3 is a sectional view of an FET according to an example of the present invention.

FIG. 3 is a sectional view of an n-channel MOSFET according to an example of the present invention. Reference numeral 11 denotes a p-type Si substrate; and 12 and 13 denote n-type layers serving as source and drain layers, respectively. On a gate portion of substrate 11, insulating molecule film 15, donor molecule film 16, acceptor molecule film 17, and insulating molecule film 18 are sequentially stacked through oxide film 14, and gate electrode 19 is formed thereon.

Film 14 is a thermal oxide film having a thickness of about 100 Å. Films 15, 16, 17, and 18 are formed by the LB method. More specifically, an alkyl chain derivative of tetrathiofluvalene (TTF) as donor molecules is mixed with stearic acid (SA) in a molar ratio of 1:1 to obtain a monomolecular LB film, and four monomolecular LB films are stacked to constitute film 16. An alkyl chain derivative of tetracyanoquinodimethane (TCNQ) as acceptor molecules is mixed with SA in a molar ratio of 1:1 to obtain a monomolecular LB film, and four monomolecular LB films are stacked to constitute film 17. Three and four monomolecular LB films of SA are stacked to constitute films 15 and 18, respectively. Electrode 19 consists of Al.

Figure 4:
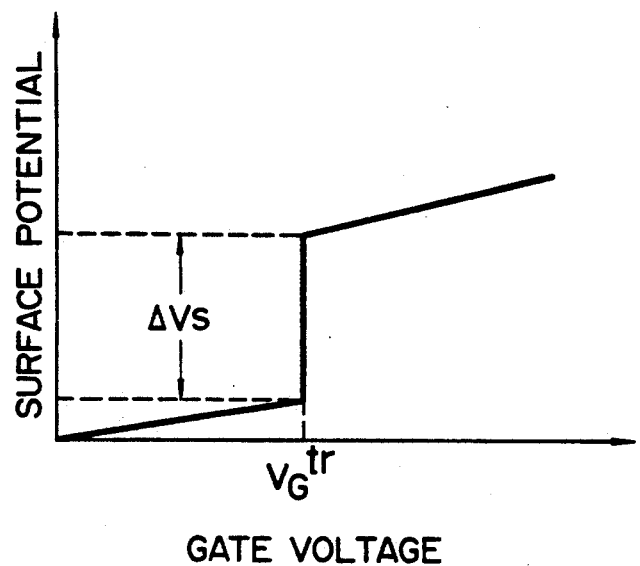
FIG. 4 is a graph showing changes in surface potential of a substrate according to changes in gate voltage in the FET of FIG. 3.

FIG. 4 shows the relationship between gate voltage $V_G$ of the MOSFET arranged in the above manner and surface potential $V_S$ of substrate 11. When voltage $V_G$ becomes certain value $V_G^{tr}$, potential $V_S$ shows discontinuous increase $\Delta V_S$. In the case of the above element, $V_G^{tr}$ and $\Delta V_s$ are respectively 1.5 and 2.0 V.

Figure 5:
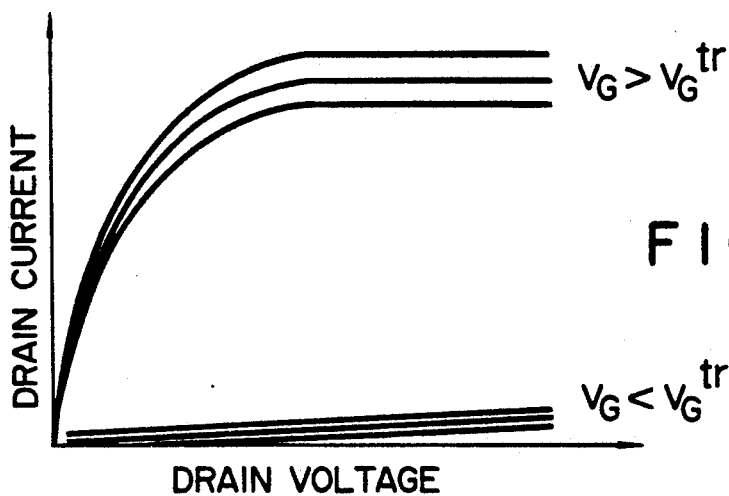
FIGS. 5 and 6 are graphs showing FET characteristics of the FET in FIG. 3.
Figure 6:
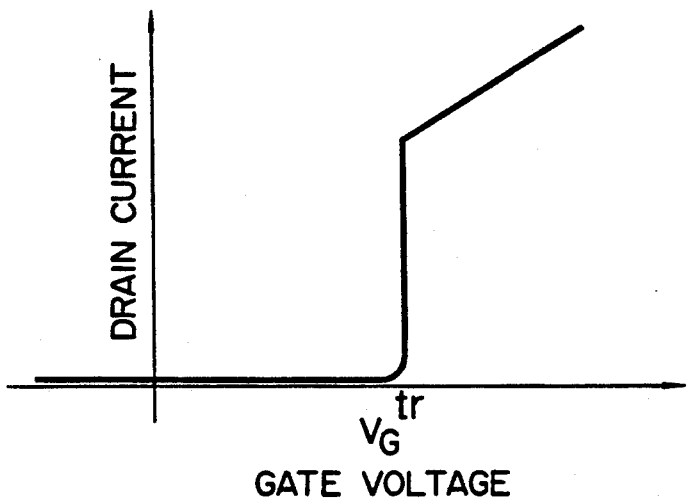

FIGS. 5 and 6 respectively show the relationships between the drain current and voltage and the drain current and gate voltage. As is apparent from FIGS. 5 and 6, the drain current rapidly increases in correspondence to discontinuous change in potential $V_s$ a threshold voltage of $V_G = V_G^{tr}$, thereby realizing switching of an FET operation.

In an element of FIG. 3, by changing the concentration of the donor or acceptor molecules, shift $\Delta V_s$ of the substrate surface potential changes.

Figure 7:
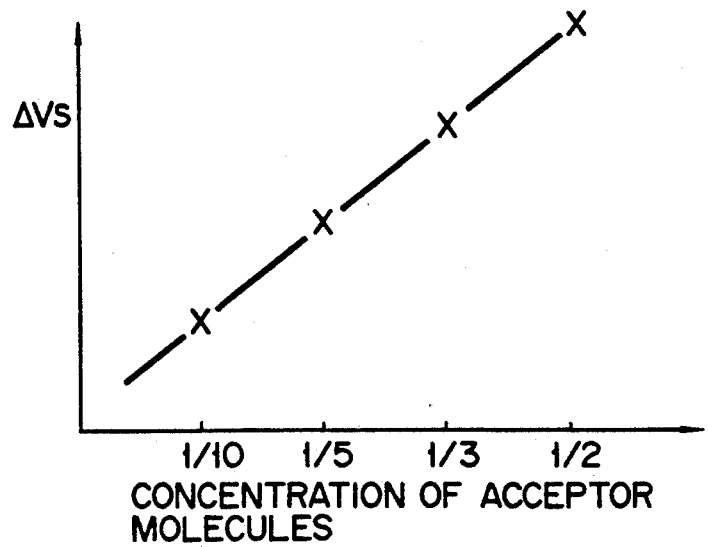
FIG. 7 is a graph showing changes in $\Delta V_s$ according to changes in concentration of acceptor molecules in an acceptor molecule film.

FIG. 7 shows changes in shift $\Delta V_s$ of the surface potential when the concentration of the donor molecules of film 16 is kept constant and the concentration of the acceptor molecules of film 17 is changed to ½, ⅓, 1/5, .... The value of $\Delta V_s$ decreases substantially in proportion to the concentration of the acceptor molecules.

In the example of FIG. 3, the number of organic molecule films may be freely selected, and the thickness of film 14 may be arbitrarily selected. By changing these number and film thickness, threshold voltage $V_G^{tr}$ changes, but basic element characteristics remain the same.

EXAMPLE 2

Figure 8:
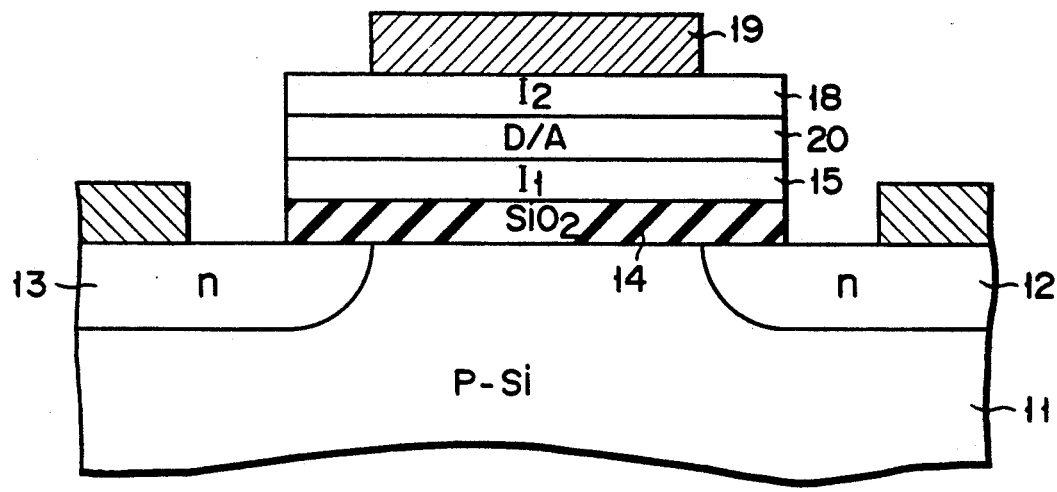
FIGS. 8, 9A-9B, 10 to 13, 18 and 19 are sectional views of FETs using a silicon substrate according to various examples of the present invention.

FIG. 8 is a sectional view of an n-channel MOSFET according to another example of the present invention. A difference between this MOSFET and the FET shown in FIG. 3 is that thin mixture film 20 including both the donor and acceptor molecules is used as a hetero structure portion of a thin organic film. Film 20 is, e.g., an LB film formed by mixing an alkyl chain derivative of TTF as donor molecules, an alkyl chain derivative of TCNQ as acceptor molecules, and SA as insulating molecules in a molar ratio of 1:1:1. The number of films 20 is, e.g., five.

This example also shows the same element characteristics as those of the previous example. By changing the concentration of the donor molecules or the acceptor molecules, the value of $\Delta V_s$ changes like the FET in Example 1.

EXAMPLE 3

Figure 9A:
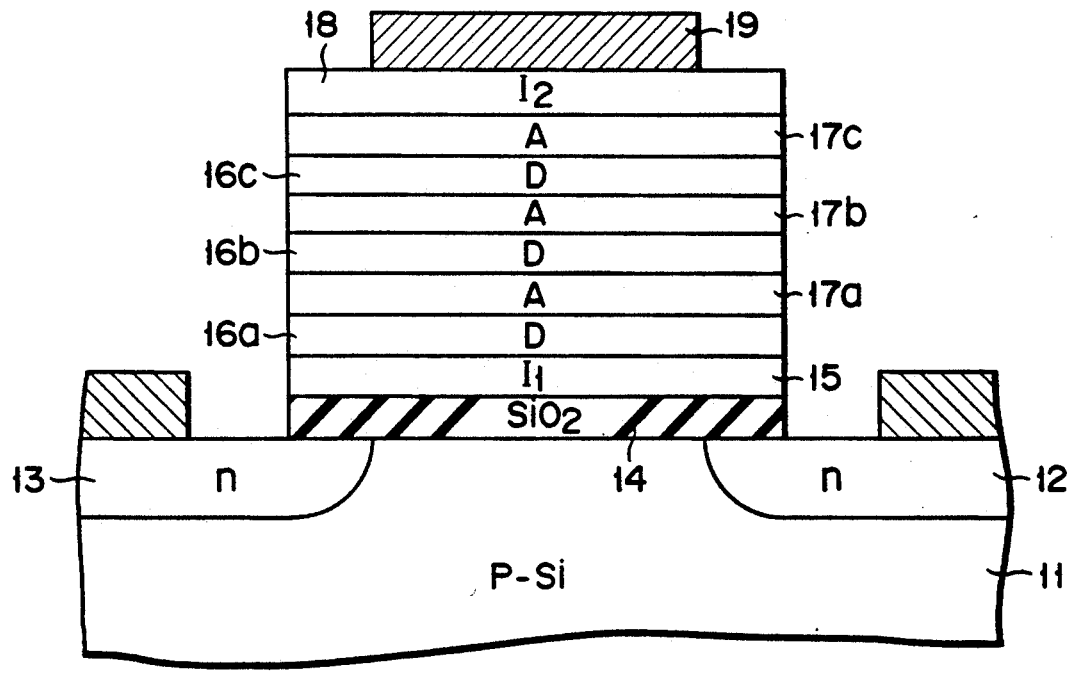

FIG. 9A is a sectional view of an n-channel MOSFET of still another example of the present invention. This example is the same as that in FIG. 3 except that a super lattice structure obtained by alternately stacking donor molecule films 16a, 16b, ... and acceptor molecule films 17a, 17b, ... is used. The same element characteristics as those of the previous examples can be obtained by this example.

EXAMPLE 4

Figure 10:
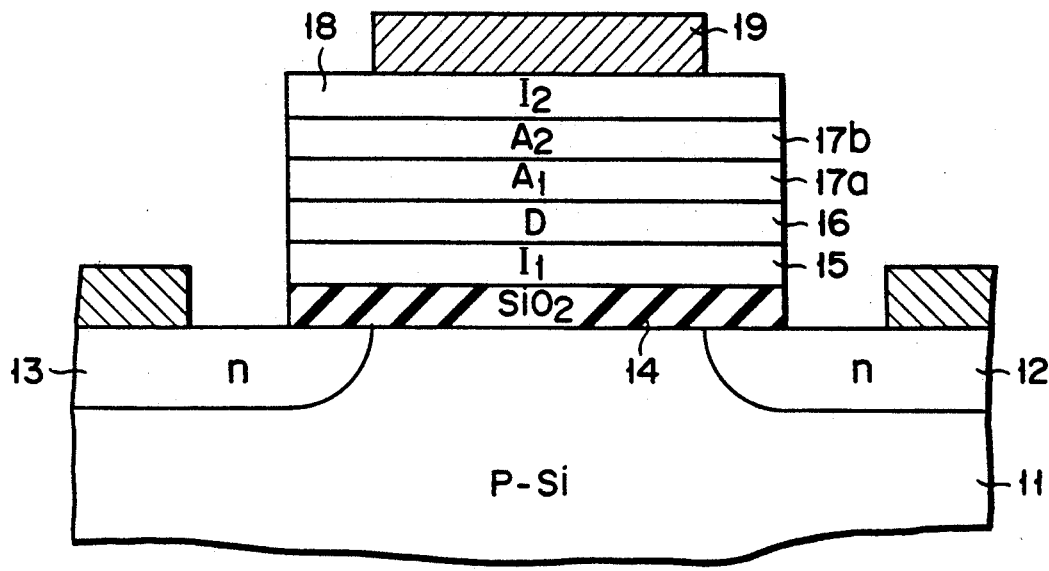

FIG. 10 is an n-channel MOSFET of still another example of the present invention. In this example, two kinds of acceptor films 17a and 17b are stacked with respect to donor molecule film 16 as a hetero structure of a gate portion. The acceptor molecule of film 17b has a larger electronic affinity than that of film 17a.

According to this example, because of a difference between the electronic affinities of the two kinds of acceptor molecules, a charge transfer state (D+A−) remains when the bias voltage is returned to below $V_G^{tr}$, thereby achieving a memory function.

EXAMPLE 5

Figure 11:
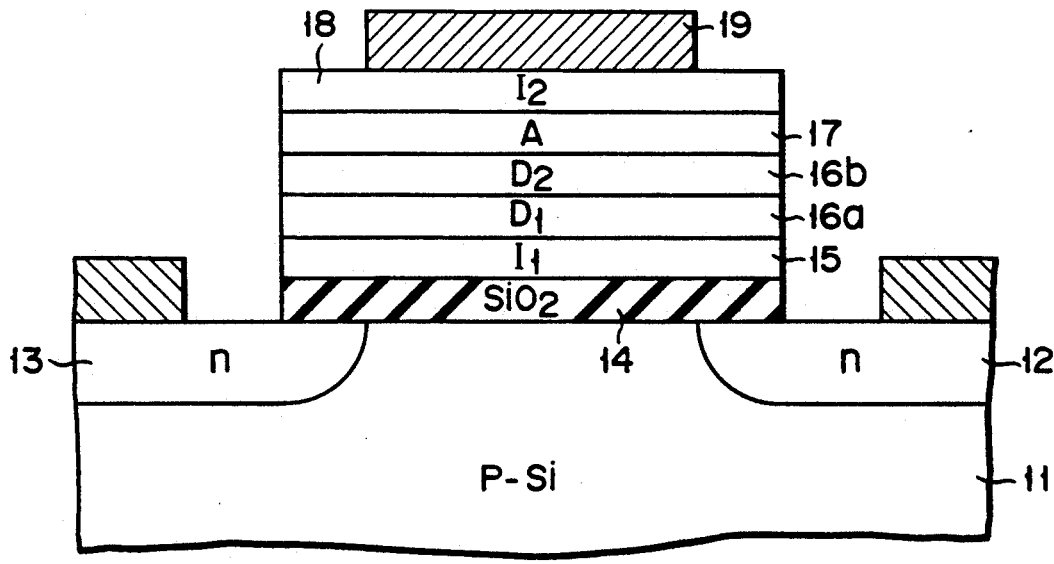

FIG. 11 is an n-channel MOSFET of still another example of the present invention. In this example, unlike in FIG. 10, two kinds of donor molecule films 16a and 16b are stacked and acceptor molecule film 17 is stacked thereon. The donor molecules of film 16b have a larger ionization potential than that of film 16a.

According to this example, the memory function is also added to the charge transfer state as in the case with the element in FIG. 10.

Figure 9B:
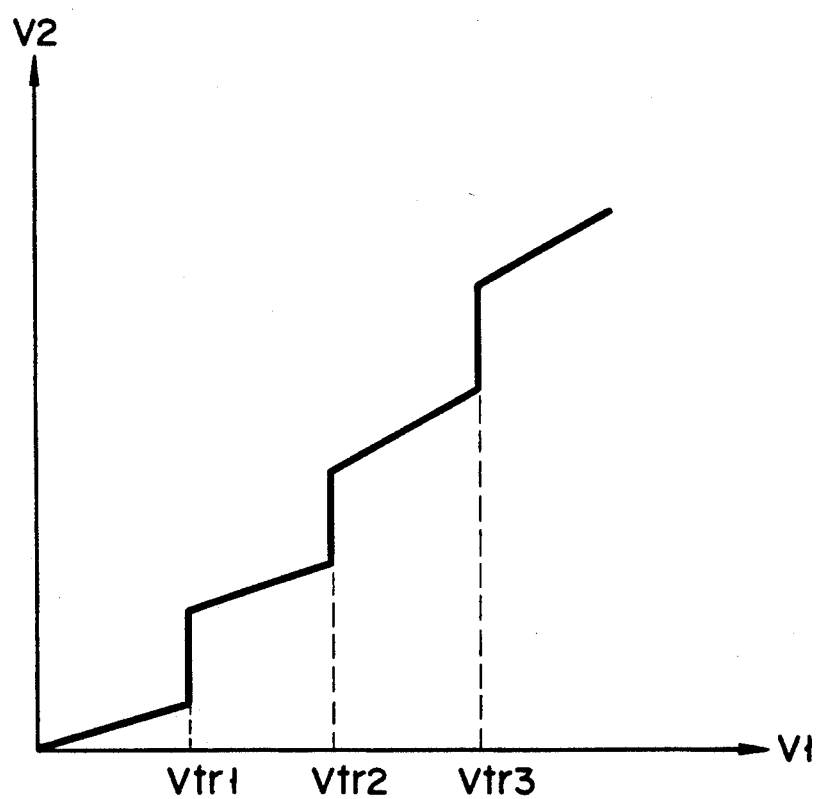

Materials of the donor molecule films and the acceptor molecule films at the supper lattice structure portion of the element in FIG. 9A may be different from each other, so that an element having a multivalue threshold voltage is obtained, as shown in FIG. 9B.

FIG. 9B shows the fact that when voltage $V_1$ applied between electrodes has various values, $V_2$ discontinuously varies, i.e., many threshold voltages $V_{tr1}$, $V_{tr2}$, $V_{tr3}$, ..., are present.

EXAMPLE 6

Figure 12:
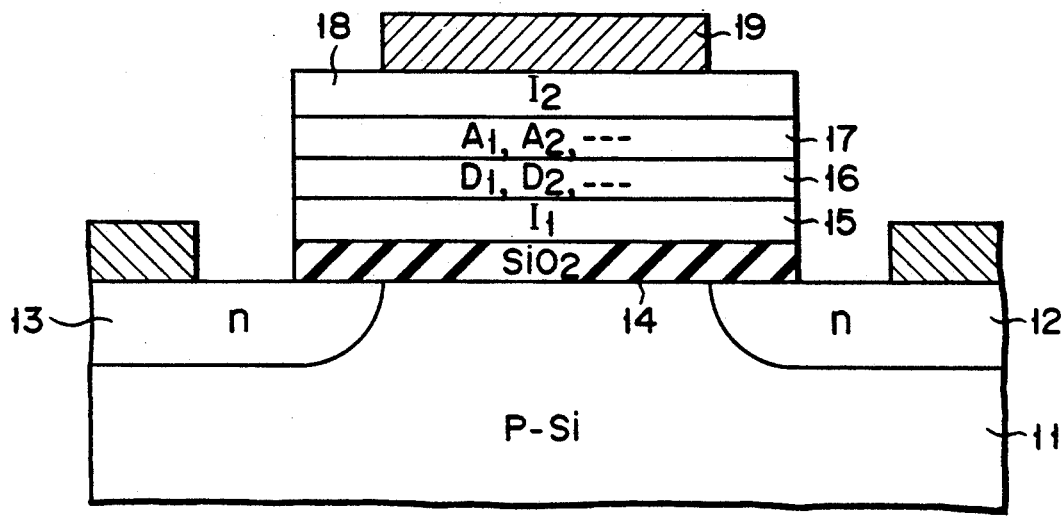

FIG. 12 is an example of an n-channel MOSFET having a multivalue threshold voltage. That is, in this example, film 16 is a thin mixture film including a plurality of kinds of donor molecules $D_1, D_2, \ldots$, and film 17 is a thin mixture film including a plurality of kinds of acceptor molecules $A_1, A_2, \ldots$. In this example, a discontinuous shift of a surface potential occurs at two points with respect to the gate voltage, thereby achieving a multivalue function, as shown in FIG. 9B.

In the above examples, oxide film 14 formed on substrate 11 may be omitted. Similarly, insulating molecule films 15 and 18 may be omitted if a barrier of a material capable of preventing charge transfer is formed between the electrode or the substrate and the thin organic film. However, the insulating molecule film is useful to reliably prevent carrier injection from the electrode or the substrate to the thin organic film so that a high efficiency of charge transfer is obtained. In addition, in terms of stability of the element characteristics, it is preferred to form these insulating films, especially, one at the side of the gate electrode. More specifically, since the gate electrode metal generally exhibits a strong acceptor or donor characteristic and has a high diffusion ability, if the gate electrode is in direct contact with the donor or acceptor molecule film, a chain compound is easily formed and degrades the element characteristics.

Figure 13:
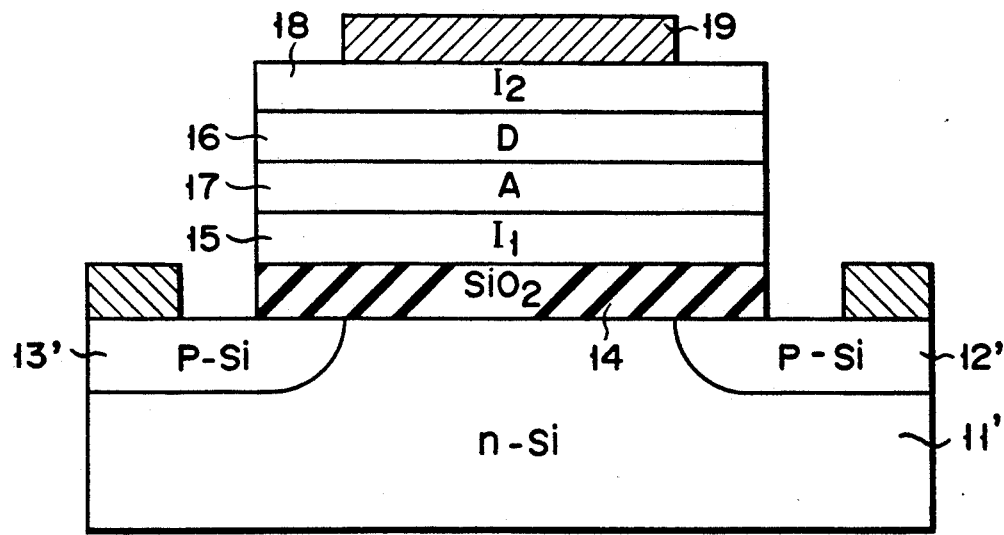

A description has been made with reference to the case wherein the present invention is applied to an n-channel MOSFET. However, as shown in FIG. 13, the present invention may be similarly applied to a p-channel MOSFET in which p-type source region 12' and drain region 13' are formed in n-type Si substrate 11'. Note that in this case, the order of the D molecule layer and the A molecule layer is the opposite of that of the n-channel MOSFET, as shown in FIG. 13.

Examples wherein the present invention is applied to a MISFET of GaAs will now be described.

EXAMPLE 7

Figure 14:
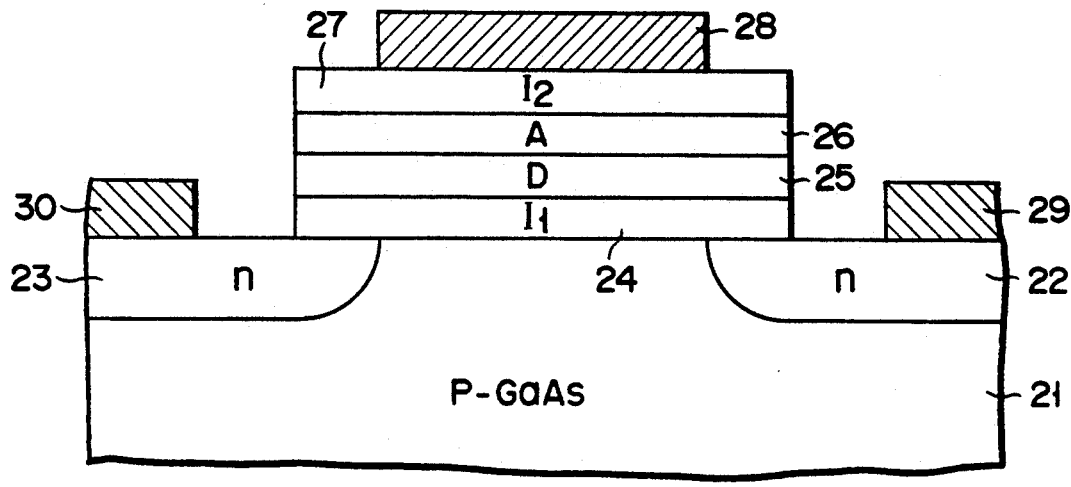
FIGS. 14 to 17 are sectional views of FETs using a GaAs substrate according to various examples of the present invention.

FIG. 14 is an n-channel MISFET according to an example of the present invention. Reference numeral 21 denotes a p-type GaAs substrate; and 22 and 23 denote n-type layers serving as a source and a drain, respectively. Insulating molecule film 24, donor molecule film 25, acceptor molecule film 26, and insulating molecule film 27 are sequentially stacked on the substrate between layers 22 and 23. Similar to the case with the example of a MOSFET using Si, these thin organic films are formed by the LB method. Gate electrode 28 is formed on the thin organic films, and source and drain electrodes 29 and 30 are respectively formed on layers 22 and 23.

According to this example, there is no so-called pinning of Fermi level, and a normal MISFET operation can be obtained. That is, changes in surface potential on the substrate semiconductor, due to electron transition from donor molecules to acceptor molecules when a voltage is applied to the gate electrode, are determined by the concentrations of the donor and acceptor molecules as indicated by equation (2). The concentrations of the donor and acceptor molecules can be controlled by forming mixture films with insulating molecules as respective thin films. A maximum of $10^{15}/cm^2$ per single molecule film can be obtained. On the other hand, an electrode surface charge required to generate a potential difference of 1 V is $10^{12}$ to $10^{13}/cm^2$. Therefore, as is apparent from equation (2), about 100 V is realized as a change in the surface potential. For this reason, even when an level density is as high as $10^{13}/cm^2 \cdot eV$, inversion of the semiconductor surface can be realized by enhancing the donor or acceptor molecule concentration, thereby realizing the FET operation. Similar to the previous examples using Si, changes in the surface potential indicate discontinuous increase, thereby achieving switching of the FET operation.

EXAMPLE 8

Figure 15:
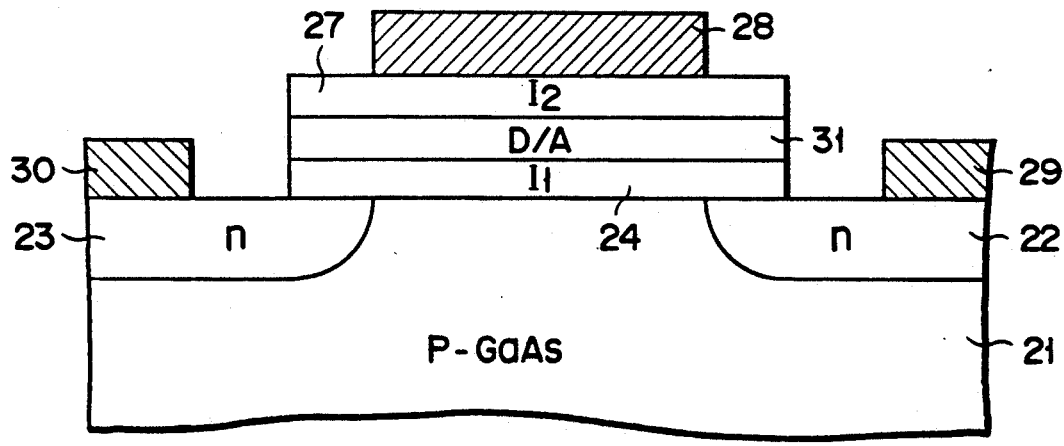

FIG. 15 is a MISFET of an example using thin mixture film including both of donor and acceptor molecules in the hereto structure portion of FIG. 14. According to this example, the same element characteristics as those of FIG. 14 are obtained.

EXAMPLES 9 and 10

Figure 16:
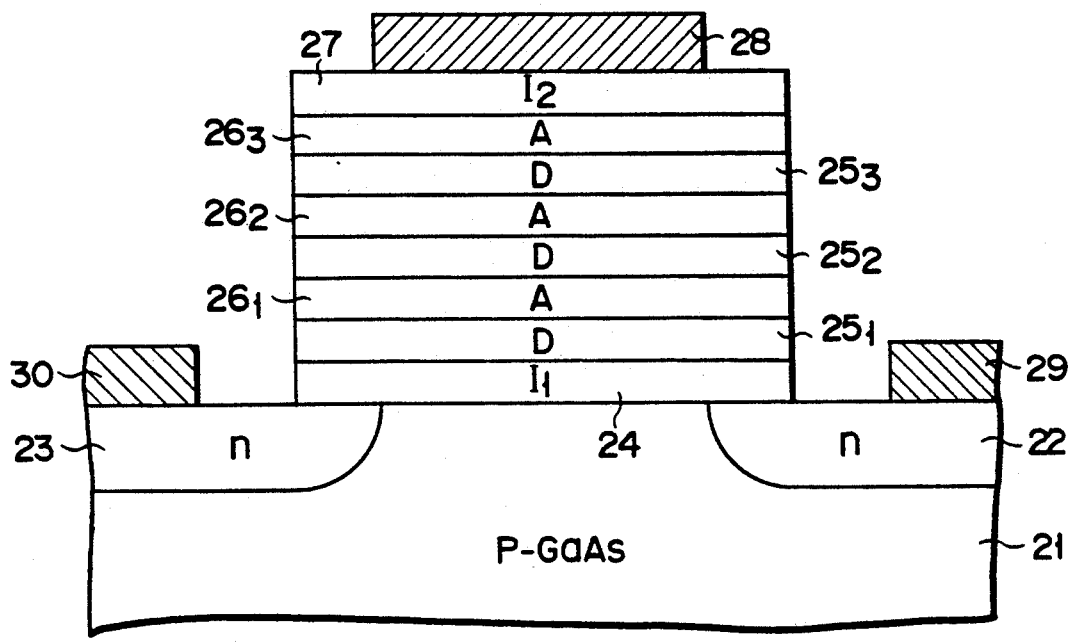
Figure 17:
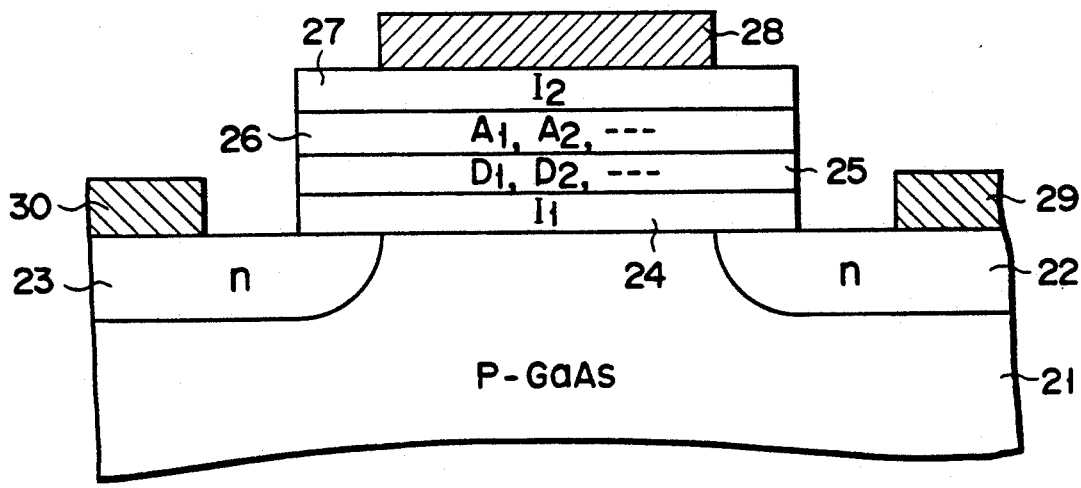

FIG. 16 is a MISFET (Example 9) utilizing a super lattice in the hetero structure of the gate portion, and FIG. 17 is a MISFET (Example 10) wherein donor molecule film 25 and acceptor molecule film 26 respectively include a plurality of types of donor molecules and acceptor molecules. These examples respectively correspond to the examples in FIGS. 9 and 12 using Si.

Although not shown, using a thin organic film structure corresponding to the examples in FIGS. 16 and 17, a MISFET of GaAs having a multi threshold value can be formed.

As has been described above, a MISFET of GaAs which is conventionally difficult to manufacture can be realized, and a novel function indicating a discontinuous current characteristic by the gate voltage can be obtained.

BY constituting the gate portion using an n-type GaAs, a p-channel MISFET can be obtained.

EXAMPLES 11 and 12

Figure 18:
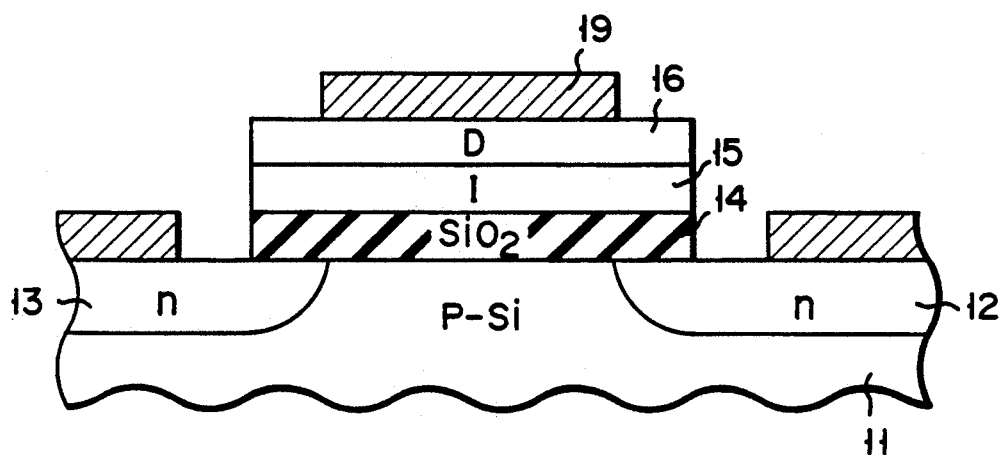
Figure 19:
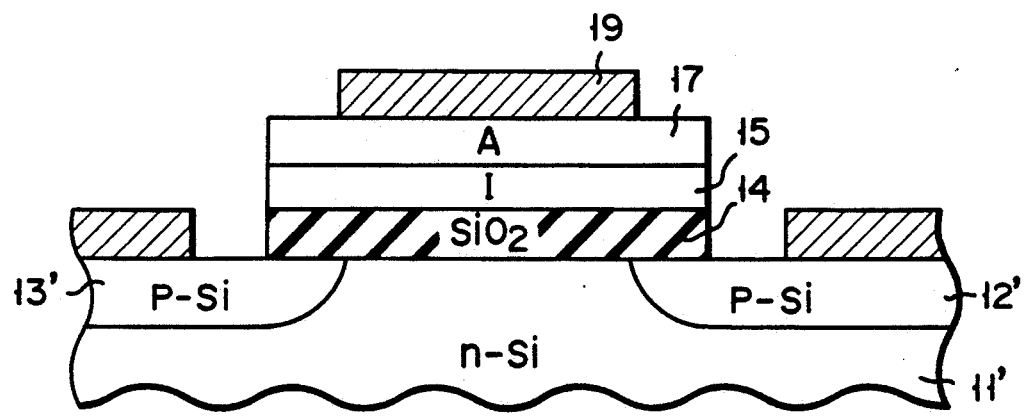

FIG. 18 is a sectional view showing an n-channel MOSFET using only donor molecule film 16 as a thin organic film. FIG. 19 is a sectional view showing a p-channel MOSFET using only acceptor molecule film 17 as a thin organic film. In these cases, when a predetermined voltage is applied to a gate electrode, charge transfer occurs between a metal which constitutes the electrode and donor or acceptor molecules, so that the same FET characteristics as Examples 1 to 10 can be obtained.

The present invention is not limited to the above examples but can be made using various III-V Group compound semiconductors such as InP, GaP, and InAs, or mixed crystals thereof, II-VI Group compound semiconductors, and amorphous semiconductors.

What is claimed is:

1. A field-effect transistor comprising a silicon substrate having a source region and a drain region, and a gate electrode, wherein a thin organic film including donor and acceptor molecules is provided between said silicon substrate and said gate electrode.

2. A transistor according to claim 1, wherein said thin organic film consists of a stacking structure of a first thin film including donor molecules and a second thin film including acceptor molecules.

3. A transistor according to claim 1, wherein said thin organic film consists of a single thin film including both of the donor and acceptor molecules.

4. A transistor according to claim 1, wherein said thin organic film consists of a super lattice structure obtained by stacking repeatedly a plurality of stacking structures of the first thin film including donor molecules and the second thin film including acceptor molecules.

5. A transistor according to claim 1, wherein said thin organic film consists of a stacking structure of a first thin film including a plurality of types of donor molecules and a second thin film including a plurality of types of acceptor molecules.

6. A transistor according to claim 1, wherein said thin organic film consists of a structure obtained by sequentially stacking a first thin film including donor molecules, a second thin film including acceptor molecules, and a third thin film including other acceptor molecules having an electronic affinity larger than that of said acceptor molecules.

7. A transistor according to claim 1, wherein said thin organic film consists of a structure obtained by sequentially stacking a first thin film including donor molecules, a second thin film including acceptor molecules, and a third thin film interposed between the first and second thin films and including other donor molecules having an ionization potential larger than that of said donor molecules.

8. A transistor according to claim 1, wherein a thin film including insulating organic molecules is formed on at least one of the surfaces of said thin organic film.

9. A transistor according to claim 1, wherein said thin organic film is formed on said silicon substrate through an inorganic insulating film.

10. A transistor according to claim 8, wherein said thin organic film is formed directly on said silicon substrate.

11. A transistor according to claim 1, wherein said thin organic film consists of a structure obtained by stacking a first thin film including donor molecules, a second thin film including acceptor molecules, and a third thin film interposed between the first and second thin films and including insulating molecules.

12. A transistor according to claim 1, wherein said thin organic film includes organic molecules having a donor radical and an acceptor radical.

13. A transistor according to claim 1, wherein said thin organic film is formed by the Langmuir-Blodgett process.

* * * * *